US009470969B2

(12) United States Patent
Cadee et al.

(10) Patent No.: US 9,470,969 B2
(45) Date of Patent: Oct. 18, 2016

(54) SUPPORT, LITHOGRAPHIC APPARATUS AND DEVICE MANUFACTURING METHOD (71) Applicant: ASML Netherlands B.V., Veldhoven (NL)

(72) Inventors: Theodorus Petrus Maria Cadee, Asten (NL); Koen Jacobus Johannes Maria Zaal, Eindhoven (NL); Harmeet Singh, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 792 days.

(21) Appl. No.: 13/686,186

(22) Filed: Nov. 27, 2012

(65) Prior Publication Data

US 2013/0164688 A1 Jun. 27, 2013

Related U.S. Application Data

(60) Provisional application No. 61/579,931, filed on Dec. 23, 2011.

(51) Int. Cl.
 *G03B 27/58* (2006.01)
 *H01L 21/683* (2006.01)
 *G03F 7/20* (2006.01)

(52) U.S. Cl.
 CPC ............. *G03B 27/58* (2013.01); *G03F 7/2051* (2013.01); *G03F 7/707* (2013.01); *G03F 7/70708* (2013.01); *H01L 21/683* (2013.01)

(58) Field of Classification Search
 CPC ..... G03B 27/58; G03F 7/2051; G03F 7/707; G03F 7/70783; G03F 7/70708; H01L 21/683; H01L 21/6831; H01L 21/6833

USPC ............ 355/30, 52, 53, 55, 67, 72; 430/322; 269/58

See application file for complete search history.

(56) References Cited

U.S. PATENT DOCUMENTS

| 4,504,045 A | 3/1985 | Kenbo et al. |
|---|---|---|
| 4,666,291 A | 5/1987 | Taniguchi et al. |
| 7,088,431 B2 | 8/2006 | Ottens et al. |
| 7,411,657 B2 | 8/2008 | Ottens et al. |
| 7,440,081 B2 | 10/2008 | Gui et al. |
| 2004/0080734 A1 | 4/2004 | Taniguchi et al. |

(Continued)

FOREIGN PATENT DOCUMENTS

| JP | 62-079647 A | 4/1987 |
|---|---|---|
| JP | 01-220440 A | 9/1989 |

(Continued)

OTHER PUBLICATIONS

Machine translation of Hagiwara JP 08-321457.*

(Continued)

*Primary Examiner* — Toan Ton
*Assistant Examiner* — Mona M Sanei
(74) *Attorney, Agent, or Firm* — Sterne, Kessler, Goldstein & Fox P.L.L.C.

(57) ABSTRACT

A support for an object, e.g., a semiconductor substrate, includes a main body having a surface configured and arranged to have a plurality of projections. Each of the projections has an associated electrostatic actuator for displacing a free end of the associated projection relative to the main body at least in a direction in a plane parallel to a main surface of the object.

20 Claims, 6 Drawing Sheets

(56) References Cited

U.S. PATENT DOCUMENTS

| | | | |
|---|---|---|---|
| 2004/0166421 A1* | 8/2004 | Yamaguchi et al. | 430/5 |
| 2005/0079737 A1 | 4/2005 | Kellerman et al. | |
| 2005/0087939 A1 | 4/2005 | Caldwell et al. | |
| 2005/0099758 A1 | 5/2005 | Kellerman et al. | |
| 2006/0098176 A1* | 5/2006 | Gui et al. | 355/53 |
| 2010/0112468 A1 | 5/2010 | Poock et al. | |
| 2011/0221300 A1* | 9/2011 | Shimanouchi et al. | 310/300 |
| 2012/0026480 A1 | 2/2012 | Loopstra et al. | |

FOREIGN PATENT DOCUMENTS

| | | |
|---|---|---|
| JP | 08-321457 A | 12/1996 |
| JP | 2005-183973 A | 7/2005 |
| JP | 2006-146195 A | 6/2006 |
| JP | 2010-080980 A | 4/2010 |
| JP | 2012-028770 A | 2/2012 |
| WO | WO 03/052804 A1 | 6/2003 |
| WO | WO 2010/032224 A2 | 3/2010 |

OTHER PUBLICATIONS

English-Language Abstract for Japanese Patent Publication No. 01-220440 A, published Sep. 4, 1989; 1 page.

English-Language Abstract for International Patent Publication No. 03/052804 A1, published Jun. 26, 2003; 1 page.

English-Language Abstract for Japanese Patent Publication No. 08-321457 A, published Dec. 3, 1996; 1 page.

* cited by examiner

SUPPORT, LITHOGRAPHIC APPARATUS AND DEVICE MANUFACTURING METHOD

BACKGROUND

1. Field of Invention

The present invention relates to a support, a lithographic apparatus and a device manufacturing method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The machine may be one in which a liquid having a relatively high refractive index, e.g., water, fills a space between the final element of the projection system and the substrate. In an embodiment, the liquid is distilled water, although another liquid can be used. Another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g., quartz) suspended therein, or a liquid with a nano-particle suspension (e.g., particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, and the like.

The lithographic apparatus may be an EUV apparatus which uses extreme ultra violet light (e.g., having a wavelength of 5-20 nm).

SUMMARY

It is desirable to provide a support in which measures are taken to improve the flatness of an object, e.g., a substrate, on the support.

According to an aspect of the present invention, there is provided a support for an object comprising: a plurality of projections projecting from a surface of a main body; each of the projections having an associated electrostatic actuator for displacing a free end of the associated projection relative to the main body.

According to an aspect of the present invention, there is provided a device manufacturing method comprising projecting a radiation beam onto a top surface of a substrate supported on free ends of a plurality of projections from a surface of a main body of a substrate support, wherein the profile of the top surface of the substrate is changed by displacing the free end of at least one of the projections relative to the main body using an electrostatic actuator associated with the projection.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

As disclosed in WO 2010/032224, hereby incorporated in its entirety by reference, instead of a conventional mask a modulator may be configured to expose an exposure area of the substrate to a plurality of beams modulated according to a desired pattern. The projection system may be configured to project the modulated beams onto the substrate and may comprise an array of lenses to receive the plurality of beams. The projection system may be configured to move the array of lenses with respect to the modulator during exposure of the exposure area.

Substrates with increasing sizes are to be handled in a lithographic apparatus. Presently substrate sizes up to 300 mm are used in lithographic processes. It is desirable to increase substrate diameters, for example to a diameter of approximately 450 mm. These larger substrates will have a smaller thickness to diameter ratio, resulting in a reduced bending stiffness. As a result, the substrates will have a larger gravitational deflection on the three e-pins in the extended position, which could inherently lead to larger substrate load grid errors and potentially also overlay errors.

Also the e-pins would need to have a larger surface area to support the increased weight of the substrate compared to a 300 mm diameter substrate and this can lead to a decrease in flatness when the substrate is clamped to the support (because in that state the substrate is not supported above the e-pins).

With an increase in the substrate area, unless a substrate table WT and substrate stage is made thinner, the depth of the substrate table WT is increased in the same proportion as the width and the length of the substrate table WT, and thus the diameter of the substrate. Thus, although, for example for a 450 mm substrate W relative to a 300 m substrate, the diameter increases proportionately by 50%, the area of the substrate W and substrate table WT each increases by 125 percent and the volume and mass of the substrate table WT would increase by almost 240%. Such an increase in volume is highly undesirable. However, in having a thinner substrate table WT, the table is less stiff, more flexible and susceptible to bending. Consequently, accurate positioning of the substrate table WT and the substrate W it is supporting is more difficult. A measure is required to enable such a more flexible substrate table WT to be used effectively, i.e., its position to be sufficiently accurately known.

A flat top surface of a substrate table can only be achieved at high cost. In addition, during use, the flatness of a substrate table can decrease. For example, this can be due to wear of the surface which supports the substrate or due to contaminant particles on the surface. Any unflatness of the support surface of the substrate table will lead to unflatness of the top surface of the substrate which is being supported on the support surface. This is a problem with all sizes of substrate but is expected to be more severe for substrates with a diameter of 450 mm compared to those with a diameter of 300 mm.

Unflatness of the top surface of the substrate can be dealt with by performing rotations in the X and Y directions (the directions orthogonal to the optical axis of the projection system) during exposure of the substrate. However, this is complex control wise and can lead to a reduction in throughput and/or can deleteriously introduce dynamic disturbances resulting in non optimal overlay and focus control.

In U.S. Pat. No. 4,504,045, which is incorporated by reference herein in its entirety, the use of piezoelectric actuators in a top surface of a substrate table has been proposed. However, it can be difficult to control the position of piezoelectric actuators over even short periods of time.

Before describing such embodiments in more detail, however, it is instructive to present an example environment in which embodiments of the present invention may be implemented.

Figure 1:
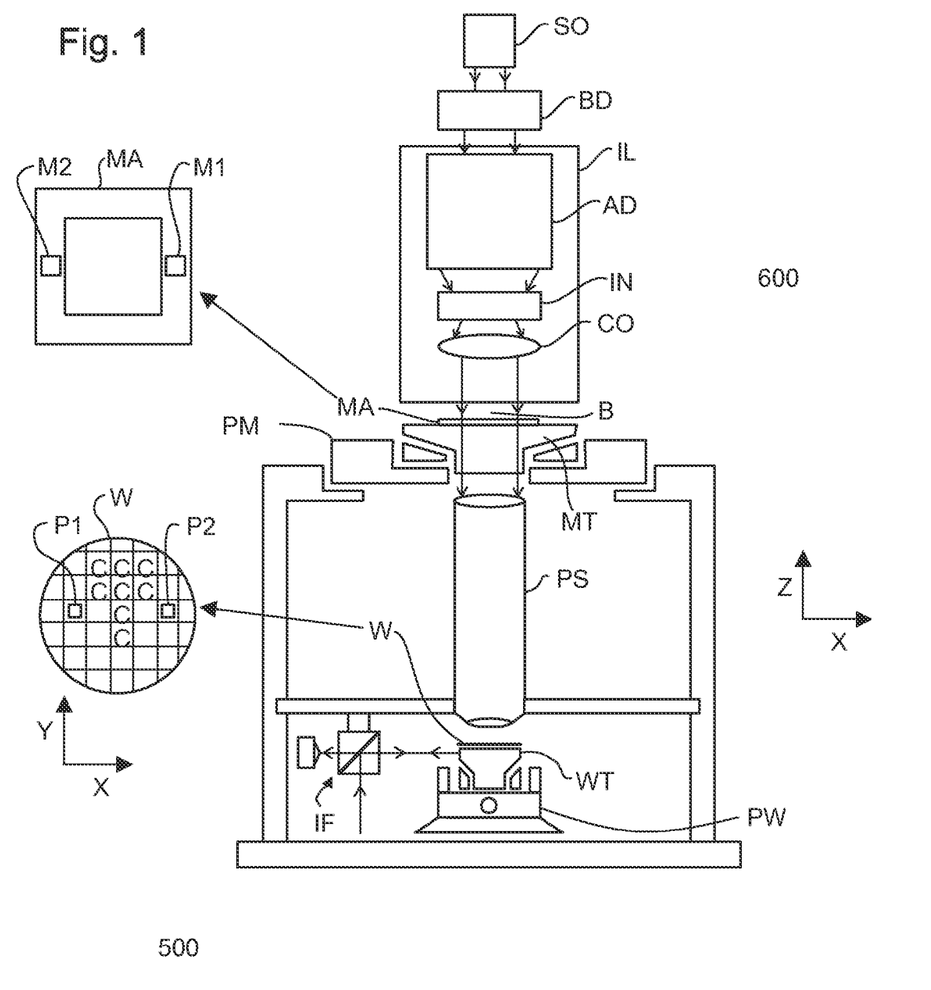
FIG. 1 depicts a lithographic apparatus according to an embodiment of the invention.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, catadioptric, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two or more tables (or stages or supports), e.g., two or more substrate tables or a combination of one or more substrate tables and one or more sensor or measurement tables. In such "multiple stage" machines the additional tables may be used in parallel, or preparatory steps may be carried out on one or more tables while one or more other tables are being used for exposure. The lithographic apparatus may have two or more patterning devices (or stages or supports) which may be used in parallel in a similar manner to substrate, sensor and measurement tables.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not exclusively mean that a structure, such as a substrate, must be submerged in liquid, but rather that liquid can be located between the projection system and the substrate and/or mask during exposure. This may or may not involve a structure, such as a substrate, being submerged in liquid. Reference sign IM shows where apparatus for implementing an immersion technique may be located. Such apparatus may include a supply system for the immersion liquid and a seal member for containing the liquid in the region of interest. Such apparatus may optionally be arranged so that the substrate table is fully covered by the immersion liquid.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion partly determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, as in other modes, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
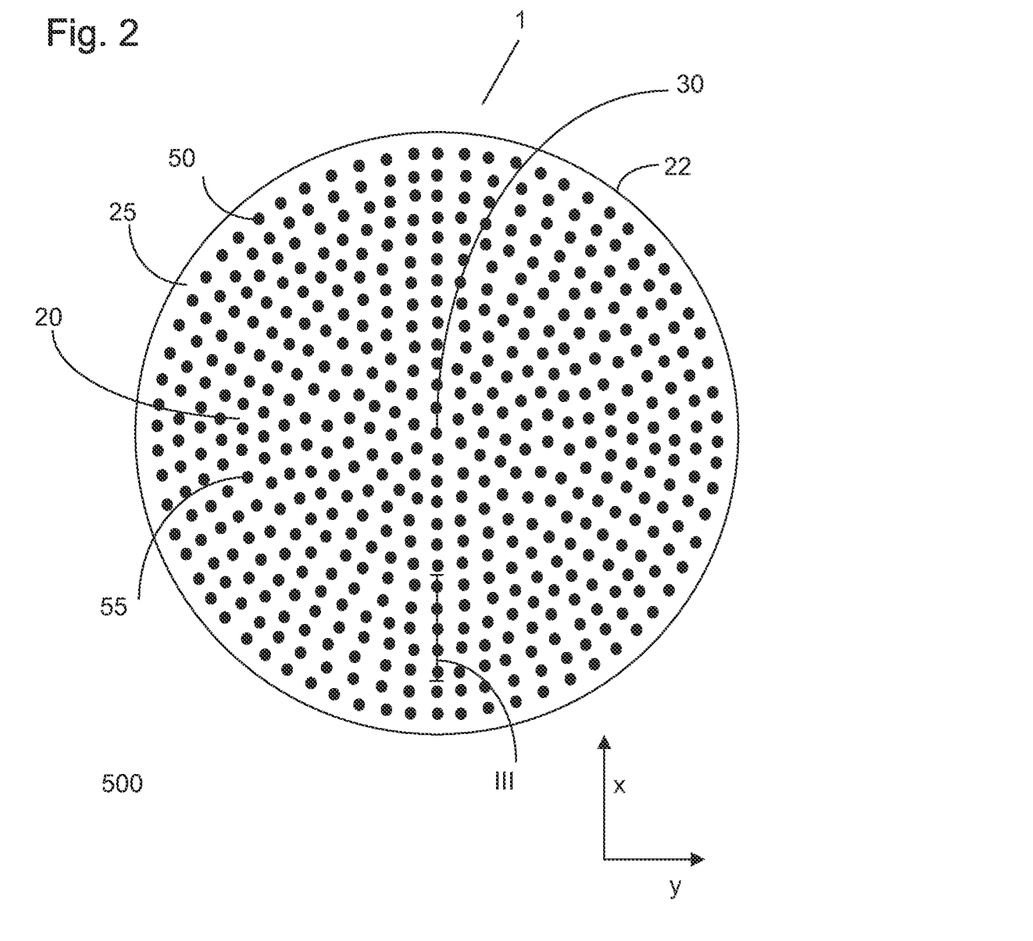
FIG. 2 illustrates schematically and in plan a support according to an embodiment.

The lithographic apparatus comprises a substrate table WT. An upper part of the substrate table WT is shown in more detail in FIGS. 2-8. FIG. 2 is a plan view of an embodiment of a support 1 of a substrate table WT. The support 1 is configured to support an object, in the case of a lithographic apparatus a substrate W.

The support 1 comprises a support surface 20. The support surface 20 is configured to support the substrate W on the substrate table WT. The support surface 20 is defined by a quantity of discrete burls (projections 50, shown as black dots in FIG. 2) which extend from a top surface 25 of a main body 22 to a supporting height.

Projections 50 may have a pitch of about 1.5-3.0 mm, for example. In an embodiment there are at least 40,000 projections which form the support surface 20. In an embodiment there may be up to 60,000 burls forming the support surface 20, or more. The top surface of the projections 50 on which the substrate W is supported defines the support surface 20.

The projections 50 are present in order to reduce the surface area in contact with the substrate W when the substrate W is placed on the substrate table WT. Each point of contact is a source of potential contamination; reducing the total contact area reduces the chance of contamination.

The support 1 is configured to receive the substrate W at a pre-defined area on the support surface 20. The pre-defined area comprises a center 30. The center 30 will receive the center of the substrate W to be placed on the substrate table WT.

The pre-defined area may be designed to receive a substrate W of relatively large size, for example a circular substrate of 450 mm in diameter. Such a large sized substrate W will have a small thickness to diameter ratio, resulting in a reduced bending stiffness. In an embodiment the pre-defined area may be designed to receive a substrate W of a different shape, in plan and/or of a different size to a circular substrate of 450 mm diameter.

Figure 3:
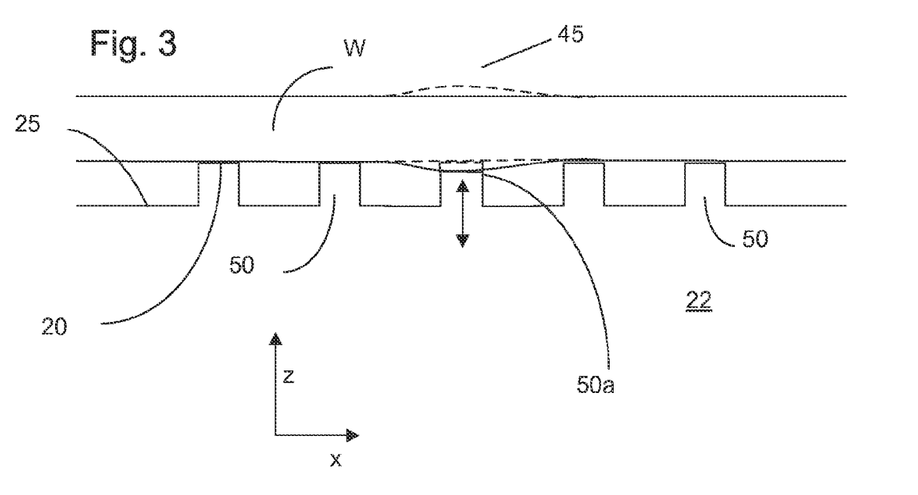
FIG. 3 illustrates a cross-section through line III of FIG. 2.

FIG. 3 is a cross-section through the embodiment of FIG. 2 through line III marked on FIG. 2. FIG. 3 shows the plurality of projections 50 which at their free end have a surface which forms the support surface 20 and on which the substrate W is supported.

Illustrated in dashed lines is the position of the substrate W and of a projection 50a just after the substrate W has been placed on the support 1. An area of unflatness 45 (a projection) is present. Without adjustment, in order to avoid focus and/or overlay errors during imaging rotation about the X and/or Y axis during scanning is required. By adjusting the position of the projection 50a under the area of unflatness 45 in the Z-direction (downwards) the flatness of the top surface of the substrate W (shown in solid lines) can be improved. This results in there being less need for rotations in the Rx and Ry directions during imaging and/or in reduced overlay and/or focus errors.

The support 1 may be any sort of support 1. It may be a support 1 which works on generating an underpressure between the bottom of the substrate W, projections 50 and top surface 25 of the main body 22. In an alternative embodiment the support 1 may be an electrostatic support 1 in which the substrate W is attracted to the support 1 by means of an electrostatic force. Electrostatic force is generated by applying a potential difference between an electrode of the support 1 and the substrate W (which may need a conducting coating applied to its bottom surface for this purpose).

The way in which the projection 50a may have its free end which forms part of the support surface 20 displaced relative to the main body 22 will be described with reference to FIGS. 4-8. In an embodiment each of the projections 50 have an associated electrostatic actuator 70 for displacing the free end of the projection 50 associated with the electrostatic actuator 70 relative to the main body 25. In this way the shape of the support surface 20 can be changed.

The advantage of an electrostatic actuator 70 over, for example a piezoelectric actuator is that the displacement of such an electrostatic actuator 70 is constant for a given potential difference across electrodes of the electrostatic actuator 70. Therefore, such a system is stable over time and drift in position between setting of the position of the electrostatic actuator 70 and imaging is unlikely to occur or only to be small. This is because an electrostatic actuator 70 maintains the charge applied to it in the electrodes (electrically conductive layers 72, 74) and it is this potential difference across a gap 76 (either occupied by a vacuum, a gas or mixture of gases or a dielectric material between electrodes (electrically conductive layers 72, 74), which results in the displacement. Therefore, there is no leaking of the charge from the electrodes (electrically conductive layers 72, 74) because the charge is not distributed into the gap 76. This contrasts with piezoelectric actuators where the charges are distributed into the material of the piezoelectric actuator which can tend to result in drift in position over time.

Figure 4:
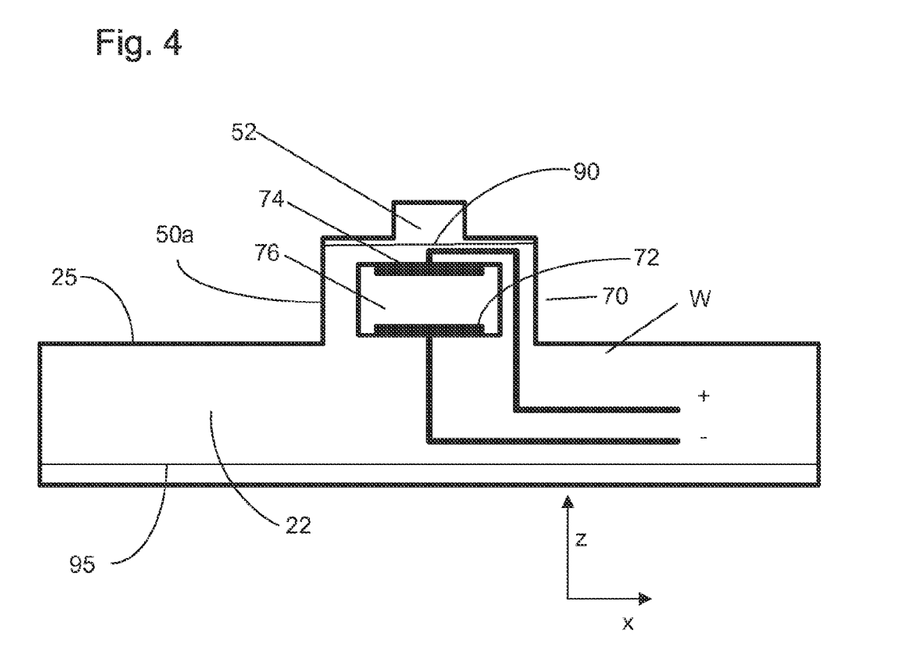
FIG. 4 illustrates, in cross-section, a detail of an actuator and associated projection.

FIG. 4 illustrates, in cross-section, an embodiment of a projection 50a and an associated electrostatic actuator 70. The projection 50a includes a sub-projection 52. The sub-projection 52 is formed at the free end of the projection 50a from the main body 22. The sub-projection 52 may be formed or may have a top surface of a high wear resistant material. It is the top surface of the sub-projection 52 which forms part of the support surface 20.

The projection 50a may project from the top surface 25 of the main body 22 in the direction of the optical axis and/or a direction orthogonal to the top surface 25 of the main body 22 by a few μm. A cross-sectional area, in plan, of the sub-projection 52 is less than that of the projection 50a.

In an embodiment a stroke of the electrostatic actuator 70 is of the order of 100 nm, for example between 50 and 200 nm, desirably between 80 and 120 nm.

The electrostatic actuator 70 displaces the free end of its associated projection 50a (the surface of the sub-projection 52 distal from the top surface 25 of the main body 22) which forms the support surface 20 relative to the main body 22. In an embodiment such displacement is in a direction which at least includes a component in the Z-direction. In another embodiment, for example as described with reference to FIGS. 6-8, the projection 50a is additionally or alternatively displaced in one or more directions in the plane of the top surface 25 of the main body 22. In an embodiment, the displacement is in one or more directions orthogonal to the optical axis of the apparatus.

In an embodiment each electrostatic actuator 70 comprises first and second electrically conductive layers 72, 74 as electrodes. The electrically conductive layers 72, 74 are electrically isolated from one another. In an embodiment the first and second electrically conductive layers 72, 74 are in different planes from one another. As illustrated in FIG. 4 the first and second electrically conductive layers 72, 74 are in parallel planes and separated from one another in the Z-direction. That is, the first and second electrically conductive layers 72, 74 are separated from one another in a direction perpendicular to the top surface 25 of the main body 22 from which the projection 50a projects.

The electrically conductive layers 72, 74 which are in a plane parallel to the top surface of the main body 22 are easy to manufacture. The layers may be deposited as layers onto the top surface 25 using normal manufacturing techniques such as selective laser sinter processes, spray/spin coating, sputtering, dry or wet etching, PVD, CVD etc.

A gap 76 is present between the first electrically conductive layer 72 and second electrically conductive layer 74. The gap 76 may be a void. That is, the gap 76 may not be filled with any material. The void may be a vacuum or a space at least partly filled with gas. In an alternative embodiment the gap 76 may be filled with a dielectric material. Preferably the dielectric material has a low E modulus and is electrically insulating and does not break down at the sort of charges generated between the first and second electrically conductive layers 72, 74 (perhaps up to 3000 V). The dielectric material in the gap 76 may be selected from one or more materials in the group comprising: a glass, a ceramic, a glass ceramic etc. The dielectric material may be deposited using normal manufacturing techniques such as selective laser sinter processes, spray/spin coating, sputtering, dry or wet etching, PVD, CVD etc.

The gap 76 is typically a few μm thick (say between 1 and 5 μm thick).

In use the first and second electrically conductive layers 72, 74 have different charges applied to them. This results in attraction or repulsion between the first and second electrically conductive layers 72, 74 and corresponding movement towards or away from each other. Thereby displacement of the free end of the associated projection 50a relative to the main body, in the Z-direction is achieved.

In use it is desirable to make the top electrode (in the case of FIG. 4 of the second electrode 74) the ground electrode. This prevents any charge applied to the electrically conductive layers 72, 74 from reaching the substrate W. It may be enough to ensure that the top electrically conductive layer of the electrostatic actuator 70 is the one connected to ground in order to ensure that electric fields associated with the electrostatic actuator 70 to not interfere with the substrate W. A disadvantage of electric fields associated with the electrostatic actuator 70 interfering with the substrate W is that it may be then harder to remove the substrate W from the support 1 after imaging because an attractive force may remain.

Alternatively or additionally an isolating electrically conductive layer 90 is formed on the support 1 or in the substrate support 1 above the electrostatic actuator 70. This shields the substrate W from any electrostatic field generated by the electrostatic actuator 70 by being connected to ground. In an embodiment an isolating electrically conductive layer 95 may be provided on the bottom side of the support 1 to isolate any components under the substrate support 1 from fields associated with the electrostatic actuators 70. One or more isolating electrically conductive layers 90, 95 may be present in any embodiment.

By measuring the flatness of the top surface of the substrate W and adjusting the charge applied to the electrostatic actuators 70, the flatness of the substrate W can be improved. A control program for performing this task will be described below with reference to FIG. 9.

Figure 5:
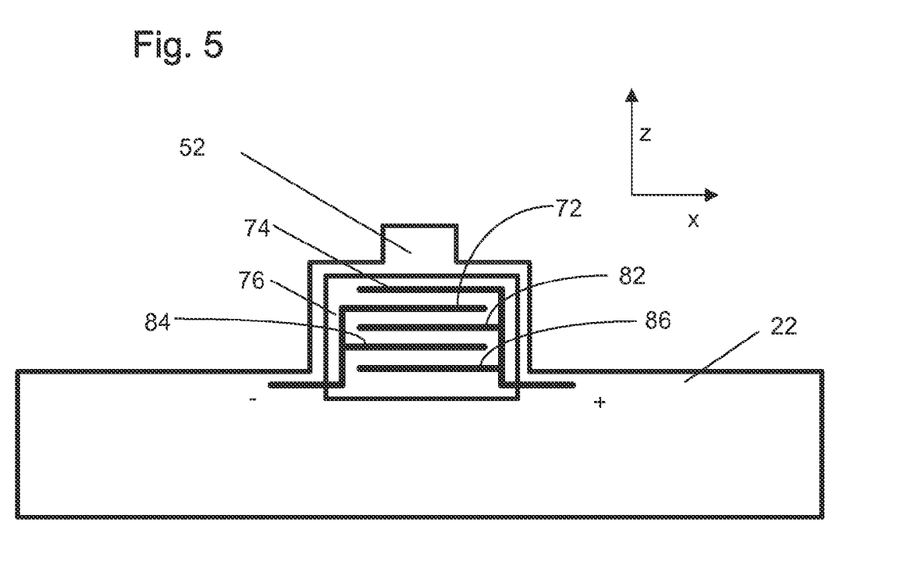
FIG. 5 illustrates, in cross-section, a detail of an actuator and associated projection.

FIG. 5 illustrates another embodiment of electrostatic actuator 70. The embodiment of FIG. 5 is the same as that of FIG. 4 except as described below. The electrostatic actuator 70 of FIG. 5 comprises at least one further electrically conductive layer 82, 84, 86.

The advantage of providing multiple electrically conductive layers 72, 74, 82, 84, 86 is that a greater stroke of the electrostatic actuator 70 is possible. The electrostatic actuator 70 may have any number of electrically conductive layers 72, 74, 82, 84 associated with it.

In the embodiment of FIG. 5 each of the electrically conductive layers 72, 74, 82, 84, 86 belongs to one of two groups. Each of the electrically conductive layers 72, 84; 74, 82, 86 in a group are connected together. For example, first electrically conductive layer 72 and further electrically conductive layer 84 are connected together and second electrically conductive layer 74 is connected to further electrically conductive layers 82 and 86. A charge can then be applied to all electrically conductive layers in each group. In the embodiment of FIG. 5 the electrically conductive layers 72, 74, 82, 84, 86 are split into two groups but the electrically conductive layers 72, 74, 82, 84, 86 may be split into any number of groups.

In an embodiment the electrically conductive layers 72, 74, 82, 84, 86 are not necessarily connected to any other electrically conductive layer 72, 74, 82, 84, 86 and the charge to each electrically conductive layer 72, 74, 82, 84, 86 or group may be individually controlled.

Figure 6:
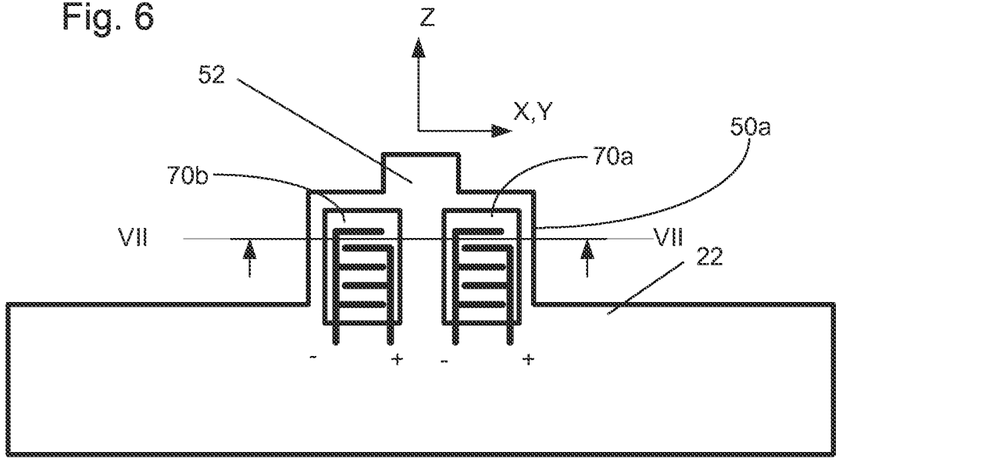
FIG. 6 illustrates, in cross-section, a detail of a projection with a plurality of associated actuators.
Figure 7:
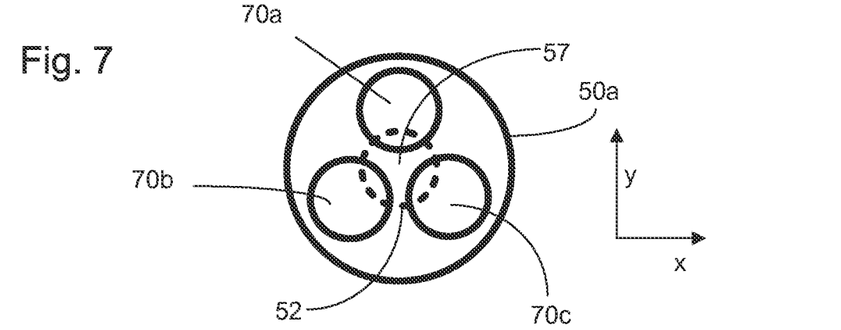
FIG. 7 illustrates, in plan, the embodiment of FIG. 6.

FIG. 6 is an embodiment in which the free end of the projection 50a is displaceable in a direction with a component in a plane parallel to the surface of the main body 22 from which the projection 50a projects. In the example of FIG. 6 the free end of the projection 50a is displaceable in the Z-direction as well as the X and Y-directions. In the embodiment of FIGS. 6 and 7 this is achieved by use of three electrostatic actuators 70a, 70b, 70c associated with the projection 50a. However, it may be possible to design a single electrostatic actuator which can move the free end of the projection 50a in the required directions, particularly if this is only two of the Z, X and Y-directions. In an embodiment two or more electrostatic actuators 70 may be associated with each projection 50. With two electrostatic actuators it is possible to arrange for movement in the Z-direction and in a direction orthogonal to the Z-direction, for example.

In an embodiment the projection 50a is displaceable in one or more of the X, Y, Z, Rx and Ry directions and in any combination of those directions.

In the embodiment of FIG. 6 three electrostatic actuators 70a, 70b, 70c are used (most clearly seen in FIG. 7 which is a cross-sectional view through line VII-VII in FIG. 6). However, a different number of actuators may be used. Each of the three associated electrostatic actuators 70a, 70b, 70c are the same as the actuator 70 of the FIG. 5 embodiment. However, other configurations are possible.

The associated electrostatic actuators 70a, 70b, 70c are distributed around an axis 57 of the projection 50a. The actuators 70a, 70b, 70c are distributed evenly around the axis 57 of the projection 70. The axis 57 of the projection 70 is in the Z-direction. The projection 50a is, in plan, circular. The actuators 70a, 70b, 70c have centers which are radially separated, in plan, by substantially 120°, as seen in FIG. 7.

In the embodiment of FIGS. 6 and 7, by actuating the three electrostatic actuators 70a, 70b, 70c movement of the free end of the projection 50a both in the Z-direction and in the X and/or Y-direction is possible. This is advantageous because it allows, for example stress relief in the substrate W by moving the free end of a projection in the X and/or Y-direction after the substrate W has been clamped to the support 1.

The embodiment of FIGS. 6 and 7 is advantageous over other ways of providing for movement of the projection 50a in the X and Y-direction because the electrically conductive layers of each of the electrostatic actuators 70a, 70b, 70c are in planes parallel to the top surface 25 of the main body 22. Thus, normal techniques can easily be used to deposit these layers.

Figure 8:
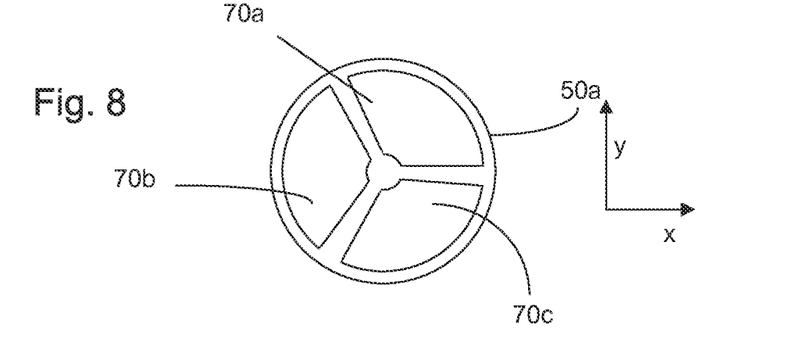
FIG. 8 illustrates, in plan, an embodiment of a projection with multiple associated actuators.

The embodiment of FIGS. 6 and 7 have electrostatic actuators 70a, 70b, 70c which are circular in plan. However, this need not be the case. FIG. 8 illustrates an embodiment which is the same as that of FIG. 7 except that the shape in plan of the electrostatic actuators 70a, 70b, 70c different.

In the embodiment of FIG. 8, in order to maximize the surface area of the electrostatic actuators 70a, 70b, 70c (and thereby their achievable force), the shape of the electrostatic actuators has been made a wedge shape. This maximizes the surface area of the electrically conductive layers of each electrostatic actuator 70a, 70b, 70c for a given total footprint of the electrostatic actuators 70a, 70b, 70c.

The support 1 may form part of a substrate table WT. Such a substrate table WT may be used in a lithographic apparatus, for example a projection lithographic apparatus.

A controller 500 is provided. The controller 500 is adapted to apply a charge to each electrostatic actuator 70. In an embodiment a part of the controller 500', 500" may be provided on the support 1, as for example illustrated in FIG. 9. However, this is not necessarily the case and the controller 500 may be provided elsewhere and may be a controller which controls other parts of the lithographic apparatus. The controller 500 is adapted individually to address each projection 50.

Figure 9:
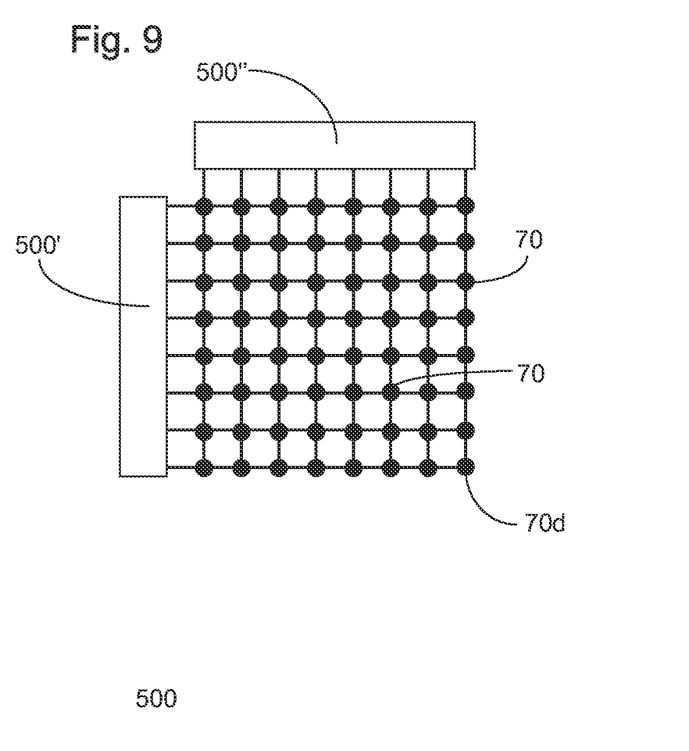
FIG. 9 illustrates schematically and in plan a connection scheme.

FIG. 9 illustrates a control system for interconnecting electrostatic actuators 70. One of the electrically conductive layers of each electrostatic actuator 70 may be connected to another electrically conductive layer of another electrostatic layer to form a grid such as illustrated in FIG. 9. Each electrically conductive layer is connected to the controller 500 using a crossed electrical network. This allows each electrostatic actuator 70 to be individually addressable. For example, in order to address one electrically conductive layer of the bottom right hand electrostatic actuator 70d illustrated in FIG. 9, the controller 500" at the top addresses the right hand most line and the controller 500' at the right addresses the bottom most line. A second crossed electrical network the same as that illustrated in FIG. 9 may be provided for the other of the electrically conductive layers of the electrostatic actuators 70. In this way it is possible individually to address each of the layers of a specific electrostatic actuator, e.g., 70d, and apply a charge.

Once a connection with the electrostatic actuator 70 has been broken, that charge remains on the electrostatic actuator (to be more specific, the charge remains between electrically conductive layers of the electrostatic actuator 70). Because of the nature of electrostatic actuators 70 mentioned above (their stability over time) once the charge of the electrostatic actuator 70 has been set, the displacement of the electrostatic actuator 70 will not vary appreciably. Therefore, it is possible using a crossed electrical network as described above individually to address the 40,000 to 60,000 projections on a typical support 1 in a relatively short time (crossed electrical networks can operate at 100 MHz allowing 100,000,000 projections a second to be addressed).

A control method will now be described. A level sensor 600 is used to measure the flatness of the top surface of a substrate W. Based on the results of the level sensor 600, a charge may be applied to one or more electrostatic actuators 70 associated with a projection 50 at which position an unflatness has been detected. After an adjustment has been made to one or more electrostatic actuators 70, the level sensor 600 may be used again to measure the flatness of the top surface of the substrate W. If the flatness does not fall within a certain tolerance, for example a pre-determined tolerance, the position of one or more of the electrostatic actuators 70 may (again or for the first time) be varied. This loop can be continued until the measurement step indicates that the flatness of the substrate W falls within the certain tolerance.

If the top most electrically conductive layer 74 of the electrostatic actuator 70 is not pre-determined to be ground (for example because of the use or an isolating electrically conductive layer 90 as described above) then adjustment of the electrostatic actuators 70 may start at zero charge being applied to the electrostatic actuators 70. This is because displacement in both towards and away from the top surface 25 of the main body 22 may be implemented (in the Z-direction). Therefore, it is possible to apply either a positive or negative charge to the top electrically conductive layer 74 as this will not effect the substrate W. However, if the top most electrically conductive layer 74 must be the one connected to ground in order to avoid electrical fields associated with the electrostatic actuator 70 from interfering with the substrate W, it may be desirable before the first flatness measurement is made to supply each of the actuators with a charge equal to 50% of the maximum charge. In this way it is possible to actuate the electrostatic actuators 70 in both positively and negatively in the Z-direction, whichever is required.

The controller 500 is adapted to control the magnitude of charge applied to each electrostatic actuator 70. In this way the controller 500 applies the electrostatic charge to each electrostatic actuator based on an input signal from the level sensor 600. In subsequent adjustment steps the charge applied to one or more electrostatic actuators 70 may be varied. Alternatively or additionally in subsequent steps through the loop charges may be applied to electrostatic actuators 70 which did not initially have a charge applied.

This system may not eliminate all unflatness of a substrate W but can reduce it to within an acceptable level. Any support 1 deformations induced due to motion of the support 1 are small compared to the unflatness of the substrate W. Additionally such deformations are predictable and so can be compensated for by, for example, movement of the support 1 during imaging.

The system may be used to achieve an approximation to local flatness. For example it may be undesirable to attempt to remove any global unflatness because a substrate support 1 may in any case be relatively flexible and will bend due to acceleration forces unavoidably. Therefore, the system of the present invention may be used to achieve an approximation to local flatness rather than an approximation to global flatness.

The main body 22 of the substrate support 1 may be based on a SiSiC material which has been found to be suitable for achieving good flatness. However, because of the provision of electrostatic actuators 70 associated with each projection 50, flatness of the main body 22 is not so critical. Therefore, other materials could alternatively be used for the main body 22.

Wires interconnecting the electrically conducting layers of the electrostatic actuators to the controller 500 may pass through an underside of the main body 22 of the substrate support 1, for example.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 436, 405, 365, 355, 248, 193, 157 or 126 nm) and extreme ultra-violet (EUV) radiation (e.g., having a wavelength in the range of 5-20 nm), as well as particle beams, such as ion beams or electron beams.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

The invention may be applied to substrates with a diameter of 300 mm or 450 mm or any other size.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include a data storage medium or data storage media for storing such computer programs, and/or hardware to receive such a medium/media. So the controller(s) may operate according the machine readable instructions of one or more computer programs.

One or more embodiments of the invention may be applied to any immersion lithography apparatus, whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc. of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or readheads that cooperate with the scale(s) or grid(s) to determine the position, velocity, etc. of the component.

The term "lens", where the context allows, may refer to any one or combination of various types of optical components, including refractive, reflective, catadioptric, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising;
   a support configured to support an object, the support comprising:
   a main body, and
   projections projecting from a surface of the main body, at least one of the projections comprising:
   a first surface coupled to the main body;
   a second surface opposite to the first surface; and
   an electrostatic actuator comprising electrodes that are positioned within the at least one of the projections and between the first and second surfaces of the at least one of the projections, the electrodes being configured to displace an entire surface area of the second surface relative to the main body in a direction with a component in a plane parallel to the surface of the main body.

2. The lithographic apparatus of claim 1, wherein the at least one of the projections comprises a plurality of electrostatic actuators.

3. The lithographic apparatus of claim 2, wherein the plurality of electrostatic actuators are distributed around an axis of the at least one of the projections.

4. The lithographic apparatus of claim 1, wherein:
   the at least one of the projections comprises a first electrostatic actuator, a second electrostatic actuator, and a third electrostatic actuator;
   the first electrostatic actuator comprises a first center;
   the second electrostatic actuator comprises a second center;
   the third electrostatic actuator comprises a third center; and
   the first center, the second center, and the third center are radially separated from each other by an angle of about 120° in a plane substantially parallel to the main body.

5. The lithographic apparatus of claim 1, wherein the at least one of the projections further comprises an isolating electrode for isolating the object from electric fields generated by the electrostatic actuator.

6. The lithographic apparatus of claim 1, further comprising a controller configured to control application of an electric charge to the electrostatic actuator based on a spatial variation in flatness of a top surface of the object.

7. The lithographic apparatus of claim 1, wherein the electrodes are configured to displace the second surface in a direction with a component in a plane perpendicular to the surface of the main body.

8. The lithographic apparatus of claim 1, wherein the electrodes are configured to displace the second surface based on attractive or repulsive forces produced between the electrodes.

9. The lithographic apparatus of claim 1, wherein the electrodes are separated from each other by a gap filled with air, gas, vacuum, or a dielectric material.

10. A support for supporting an object, the support comprising:
a main body, and
projections projecting from a surface of the main body, at least one of the projections comprising:
a first surface coupled to the main body;
a second surface opposite to the first surface; and
an electrostatic actuator comprising electrodes that are positioned within the at least one of the projections and between the first and second surfaces of the at least one of the projections, the electrodes being configured to displace an entire surface area of the second surface relative to the main body in a direction with a component in a plane parallel to the surface of the main body.

11. The support of claim 10, wherein the at least one of the projections comprises a plurality of electrostatic actuators.

12. The support of claim 11, wherein the plurality of electrostatic actuators are distributed around an axis of the at least one of the projections.

13. The support of claim 10, wherein:
the at least one of the projections comprises a first electrostatic actuator, a second electrostatic actuator, and a third electrostatic actuator;
the first electrostatic actuator comprises a first center;
the second electrostatic actuator comprises a second center;
the third electrostatic actuator comprises a third center; and
the first center, the second center, and the third center are radially separated from each other by an angle of about 120° in a plane substantially parallel to the main body.

14. The support of claim 10, wherein the at least one of the projections further comprises an isolating electrode configured to isolate the object from electric fields generated by the electrostatic actuator.

15. The support of claim 10, wherein the electrodes are configured to displace the second surface in a direction with a component in a plane perpendicular to the surface of the main body.

16. The support of claim 10, wherein the electrodes are configured to displace the second surface based on attractive or repulsive forces produced between the electrodes.

17. The support of claim 10, wherein the electrodes are separated from each other by a gap filled with air, gas, vacuum, or a dielectric material.

18. A device manufacturing method comprising:
supporting a substrate on a substrate support comprising:
a main body, and
projections projecting from a surface of the main body, at least one of the projections comprising electrodes that are positioned within the at least one of the projections; and
displacing, using the electrodes, an entire surface area of a free end of the at least one of the projections relative to the main body in a direction with a component in a plane parallel to the surface of the main body to change a profile of a top surface of the substrate.

19. The device manufacturing method of claim 18, further comprising:
producing attractive or repulsive forces between the electrodes; and
displacing the free end of the at least one of the projections based on the attractive or repulsive forces between the electrodes.

20. The device manufacturing method of claim 18, comprising displacing the free end of the at least one of the projections in a direction with a component in a plane perpendicular to the surface of the main body.

* * * * *